(12) United States Patent
Fearing et al.

(10) Patent No.: US 6,872,439 B2
(45) Date of Patent: Mar. 29, 2005

(54) ADHESIVE MICROSTRUCTURE AND METHOD OF FORMING SAME

(75) Inventors: Ronald S. Fearing, El Cerrito, CA (US); Metin Sitti, Pittsburgh, PA (US)

(73) Assignee: The Regents of the University of California, Oakland, CA (US)

( * ) Notice: Subject to any disclaimer, the term of this patent is extended or adjusted under 35 U.S.C. 154(b) by 0 days.

(21) Appl. No.: 10/197,763

(22) Filed: Jul. 17, 2002

(65) Prior Publication Data

US 2003/0208888 A1 Nov. 13, 2003

Related U.S. Application Data

(60) Provisional application No. 60/380,595, filed on May 13, 2002.

(51) Int. Cl.[7] ............................... B32B 5/02; B32B 3/06
(52) U.S. Cl. .................. 428/99; 428/119; 428/141; 428/343; 428/364; 428/399; 428/400; 428/397; 428/401; 428/85; 428/90; 24/446; 24/442; 264/219; 264/299; 264/222; 977/DIG. 1
(58) Field of Search .................. 24/446, 442; 428/119, 428/141, 343, 364, 399, 400, 99, 397, 401, 85, 90; 264/219, 299, 222; 977/DIG. 1

(56) References Cited

U.S. PATENT DOCUMENTS

| 4,545,831 A | 10/1985 | Ornstein ........................ 156/57 |
| 5,264,722 A | 11/1993 | Tonucci et al. .............. 257/443 |
| 5,392,498 A | 2/1995 | Goulait et al. ................. 24/452 |
| 5,843,657 A | 12/1998 | Liotta et al. ..................... 435/6 |
| 5,843,767 A | 12/1998 | Beattie ...................... 435/287.1 |
| 5,951,931 A | 9/1999 | Murasaki et al. ........... 264/167 |
| 5,959,200 A | 9/1999 | Chui et al. ..................... 73/105 |
| 6,393,327 B1 | 5/2002 | Scribner ...................... 607/54 |
| 6,713,151 B1 | 3/2004 | Dean et al. |
| 6,737,160 B1 | 5/2004 | Full et al. |
| 2002/0100581 A1 | 8/2002 | Knowles et al. |
| 2003/0124312 A1 * | 7/2003 | Autumn ...................... 428/141 |
| 2004/0005454 A1 * | 1/2004 | Full et al. ................... 428/343 |
| 2004/0009353 A1 | 1/2004 | Knowles et al. |
| 2004/0071870 A1 | 4/2004 | Knowles et al. |
| 2004/0076822 A1 * | 4/2004 | Jagota et al. ................ 428/364 |

FOREIGN PATENT DOCUMENTS

WO   WO 01/49776 A   7/2001

OTHER PUBLICATIONS

U.S. Appl. No. 10/655,271, filed Sep. 3, 2003, Full et al.
U.S. Appl. No. 10/338,104, filed Jan. 6, 2003, Full et al.
Matt Cartmill, "Climbing"; Functional Vertebrate Morphology, Chapter 5; 1985.

(List continued on next page.)

Primary Examiner—William P. Watkins, III
(74) Attorney, Agent, or Firm—Morrison & Foerster LLP

(57) ABSTRACT

A fabricated microstructure comprising at least one protrusion capable of providing an adhesive force at a surface of between about 60 and 2,000 nano-Newtons. A stalk supports the protrusion at an oblique angle relative to a supporting surface. The microstructure can adhere to different surfaces.

29 Claims, 9 Drawing Sheets

OTHER PUBLICATIONS

Beni Charan Mahendra, "Contributions to the Bionomics, Anatomy, Reproduction and Development of the Indian House–Gecko, *Hemidactylus Flaviviridis Ruppel*," pp. 288–306, Dec. 19, 1940.

John S. Edwards, et al., "The adhesive pads of Heteroptera: a re–examination," Proc. R. ent. Socl. Lond. (A), 45 pp. (1–5) 1970.

Duncan J. Irschick, et al., "A comparative analysis of clinging ability among pad–bearing lizards," Biological Journal of the Linnean Society, (1996) 59:21–35.

Sunder Lal Hora, "The Adhesive Apparatus on the Toes of certain Geckos and Tree–frogs," Journal of the Proceedings of the Asiatic Society 9:137 (1923).

P.F.A. Maderson, "Keratinized Epidermal Derivatives as an Aid to Climbing in Gekkonid Lizards," vol. 203, pp. 780–781, Aug. 15, 1964.

Rodolfo Ruibal, et al., "The Structure of the Digital Setae of Lizards," Department of Life Sciences, University of California, Riverside, California, Journal of Morphology, 117:271–294, Nov. 1965.

Anthony P. Russell, "Contributing to the functional analysis of the foot of the Tokay, *Gekko gecko*," Zool., Lond. (1975), 176, 437–476.

E. E. Williams, "Convergent and Alternative Designs in the Digital Adhesive Pads of Scincid Lizards," Sciences, vol. 215, pp. 1509–1511 Mar. 19, 1982.

Stork, N.E., "A scanning electron microscope study of tarsal adhesive setae in the coleoptera" Zoological Journal of the Linnean Society (1980) 68: 173–306.

Stork, N.E., "Experimental analysis of adhesion of chrysolina polita (Chrysomelidae: Coleoptera) on a variety of surfaces," Journal of Experimental Biology (1980) 88: 91–107.

Peterson, J.A. and E.E. Williams, "A case study in retrograde evolution: the onca lineage in anoline lizards. II. Subdigital fine structure," Bulletin of the Museum of Comparative Zoology (1981) 149: 215–268.

Edwards, J.S., "Observations on the development and predatory habit of two *reduviid heteroptera, phinocoris carmelita stal* and *platymeris rhadamanthus gerst*," Proc. R. Ent. Soc. Lond. (1962) 89–98.

T. Thurn–Albrecht, et al., "Ultrahigh–Density Nanowire Arrays Grown in Self–Assembled Diblock Copolymer Templates," Science (2000) 290: 2126–2129.

K. Autumn, et al., "Adhesive force of a single gecko foot–hair," Nature, vol. 405 (2000) 681–658.

Y.A. Liang et al., "Adhesion Force Measurements on Single Gecko Setae," Technical Digest of the 2000 Solid–State Sensor and Actuator Workshop, Hilton Head Island, SC (2000).

* cited by examiner

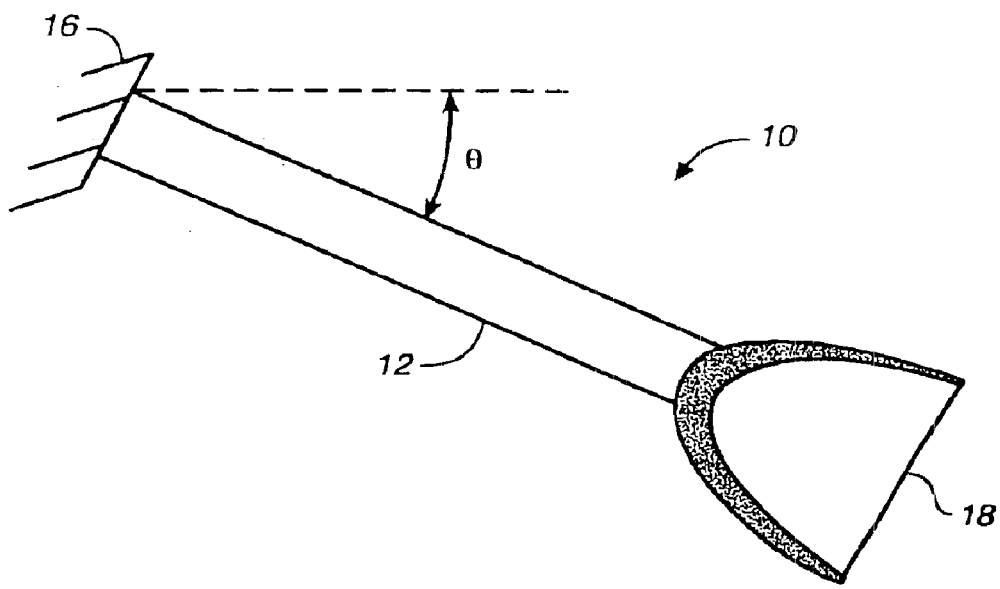
FIG._1A
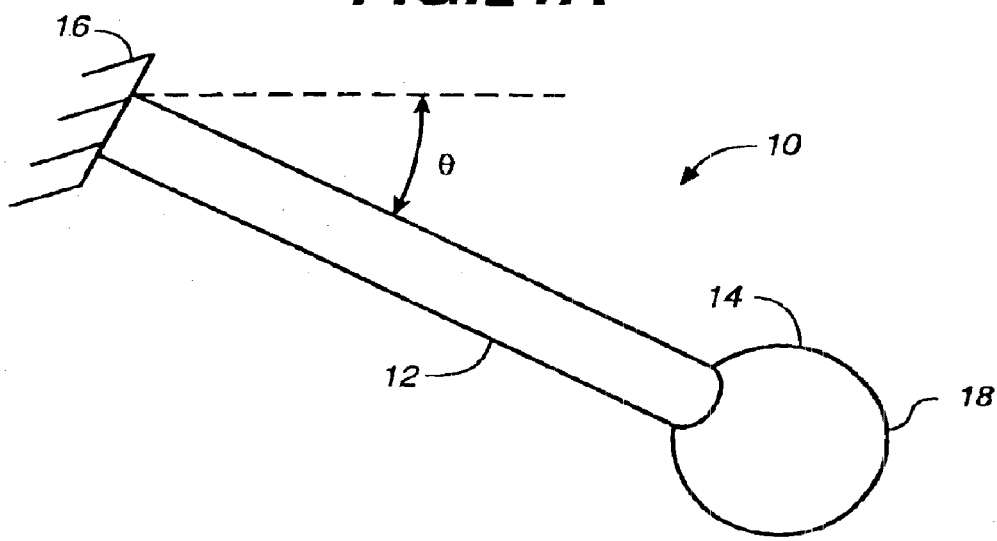
FIG._1B
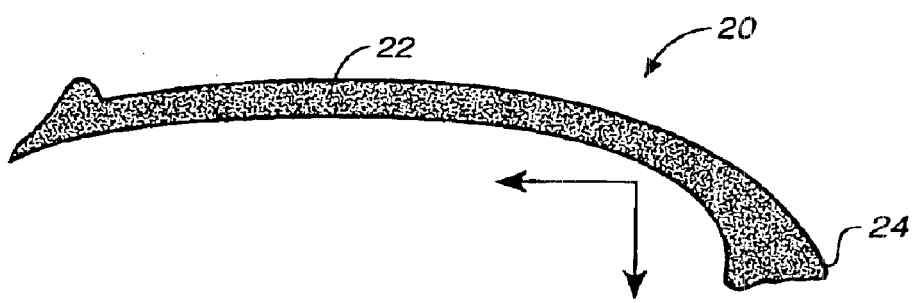
FIG._2

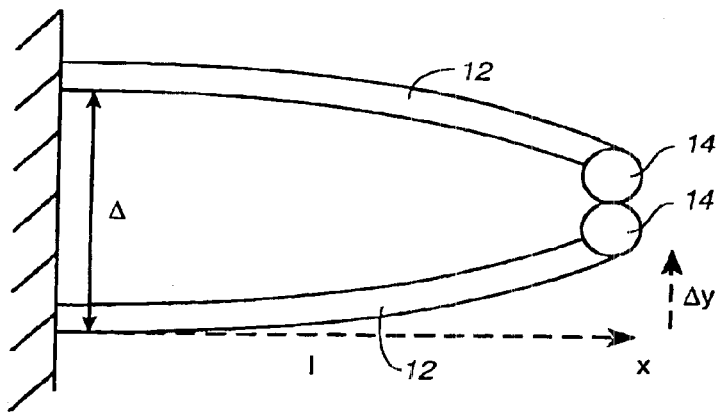
FIG._3
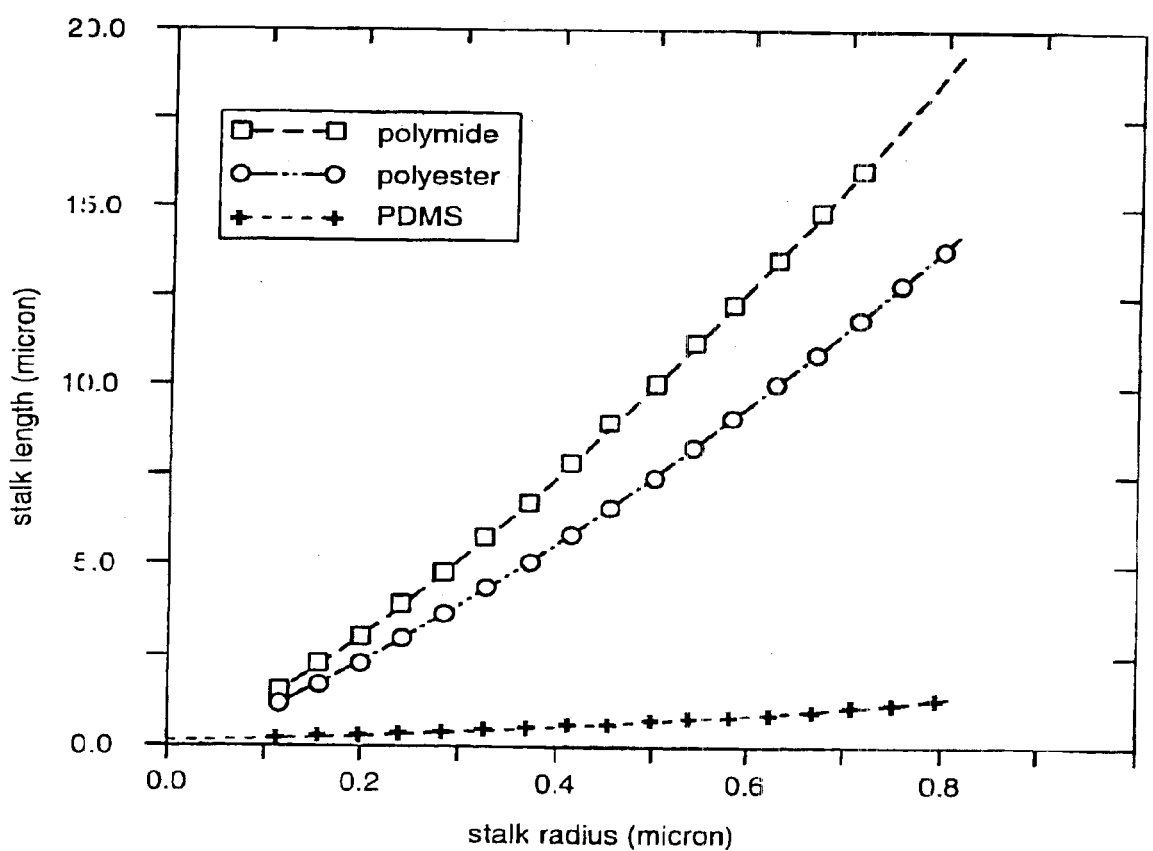
FIG._4

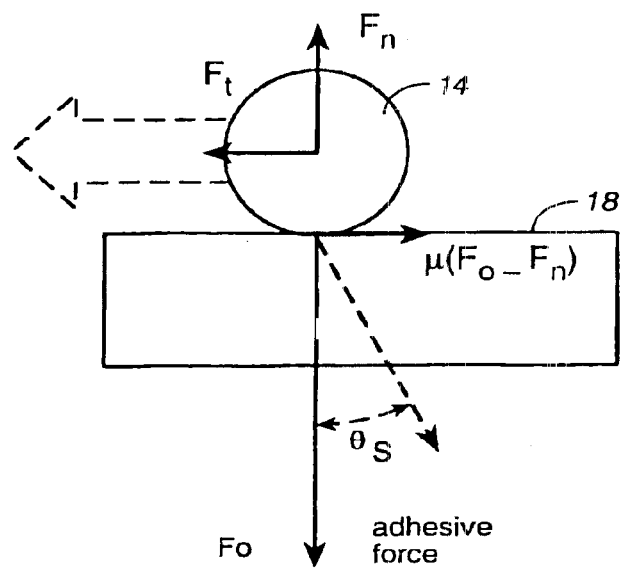
FIG._5
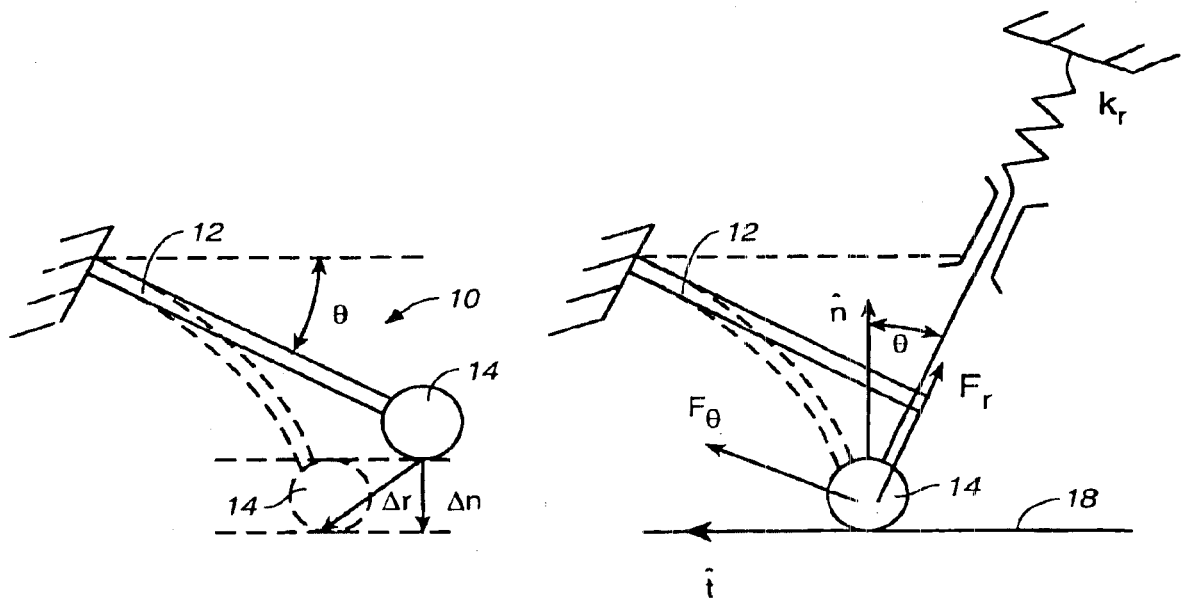
FIG._6A  FIG._6B

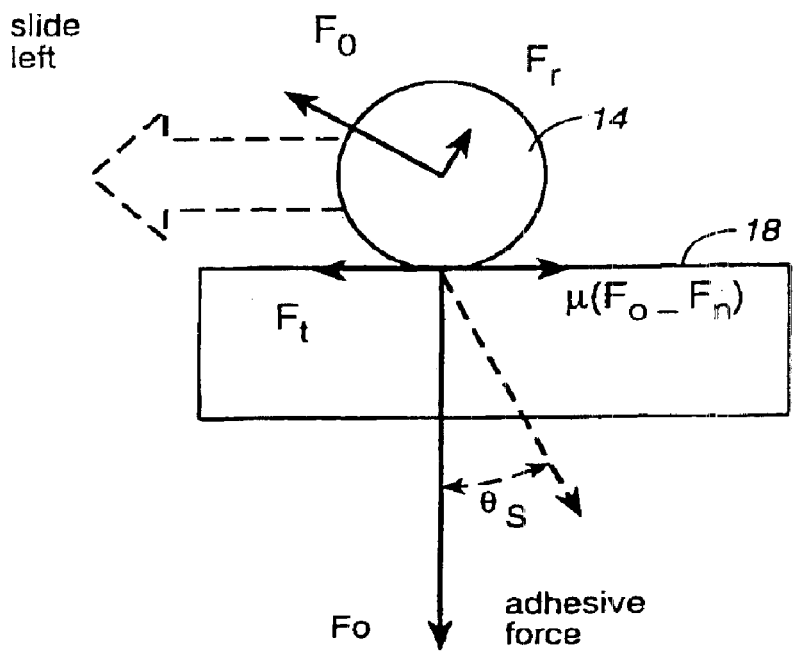
FIG._7A
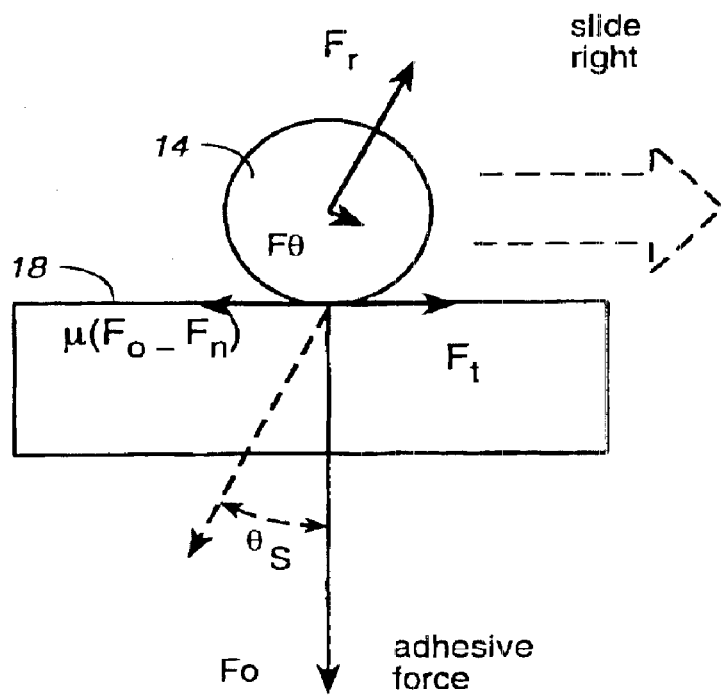
FIG._7B

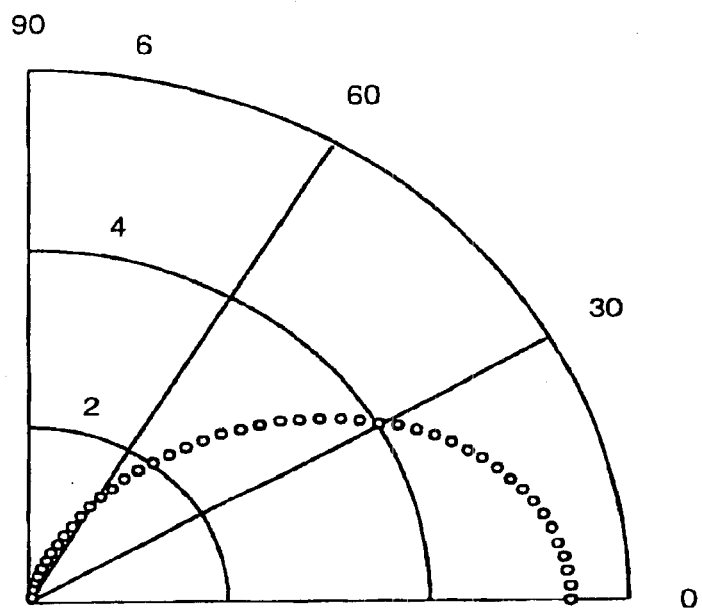
FIG._8
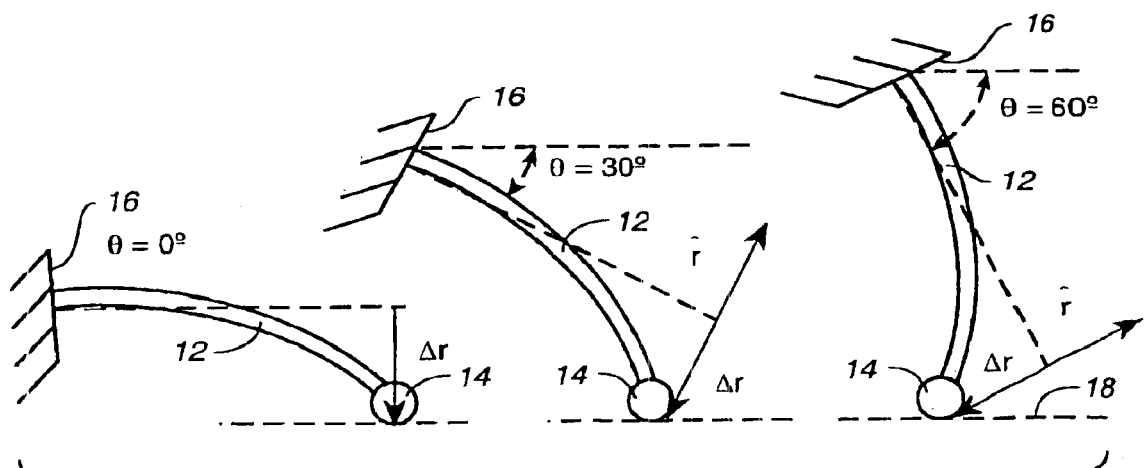
FIG._9

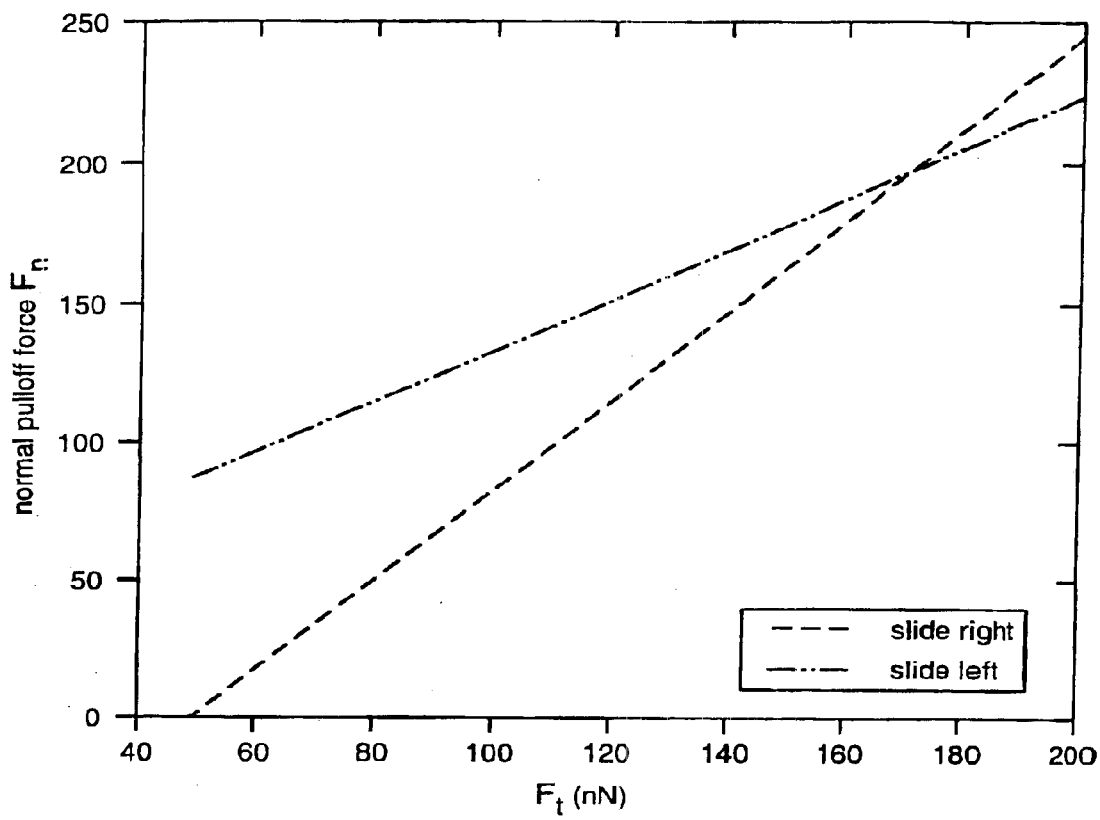
FIG._10
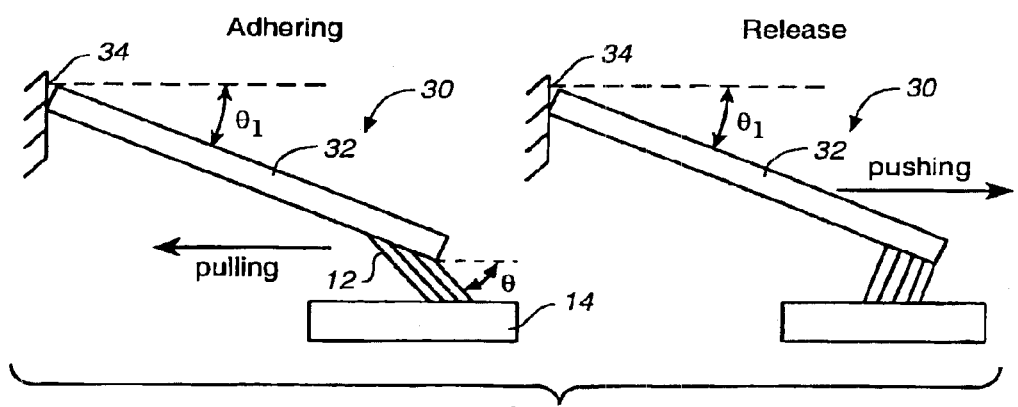
FIG._11

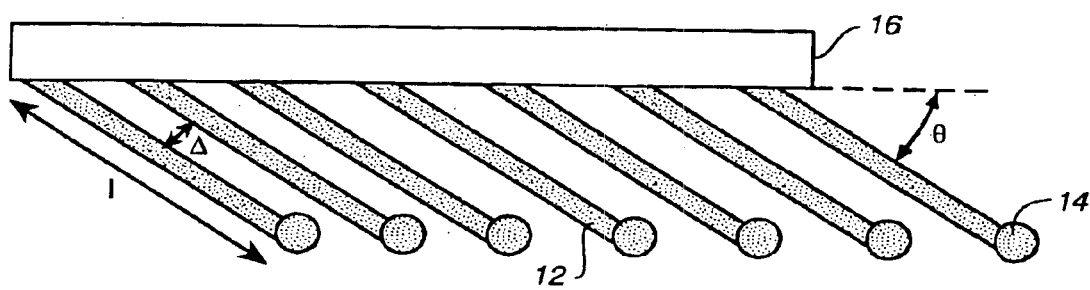
FIG._12
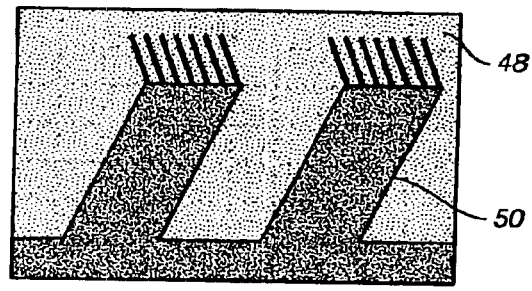
FIG._13A
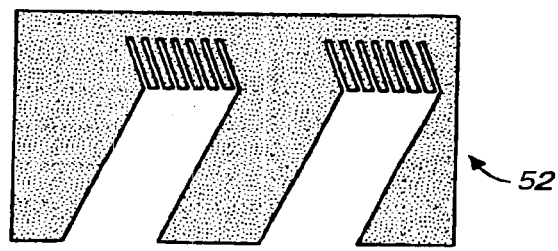
FIG._13B
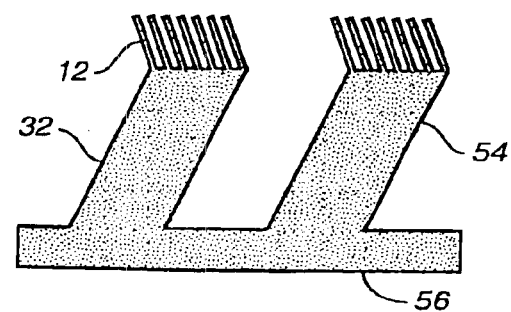
FIG._13C

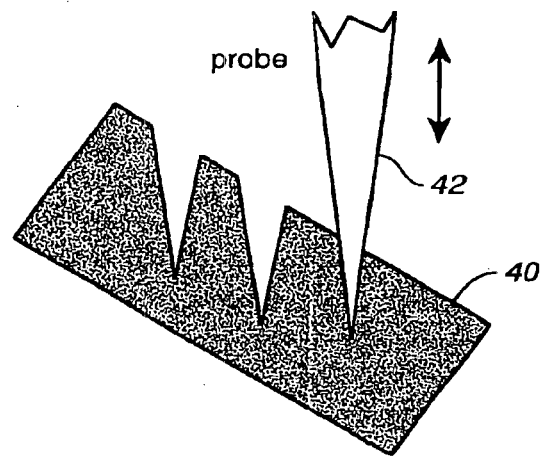
*FIG._14A*
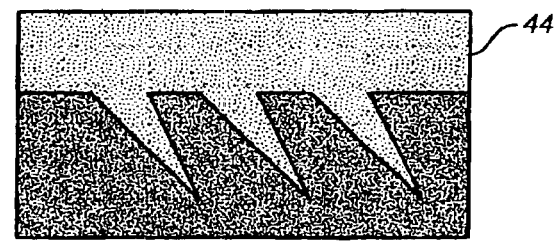
*FIG._14B*
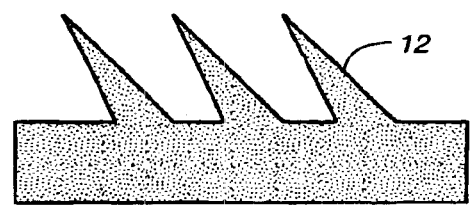
*FIG._14C*
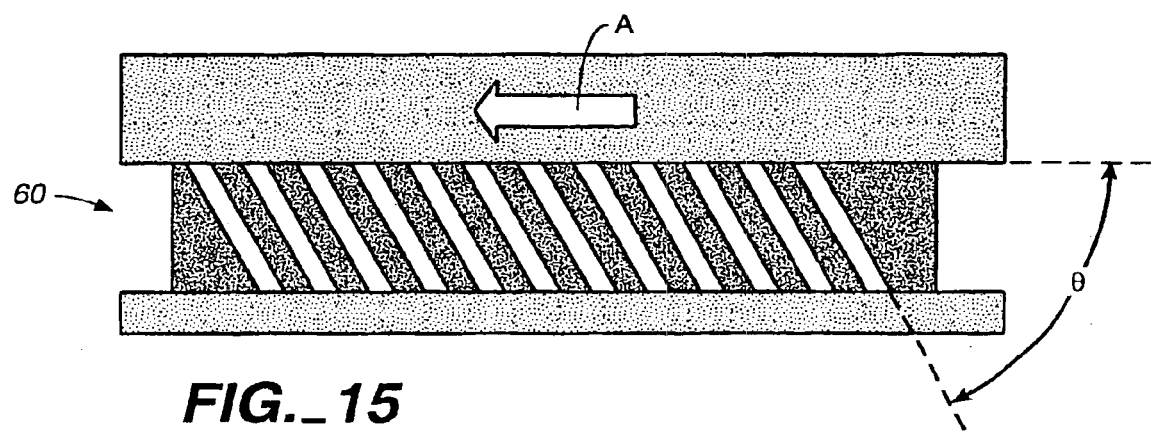
*FIG._15*

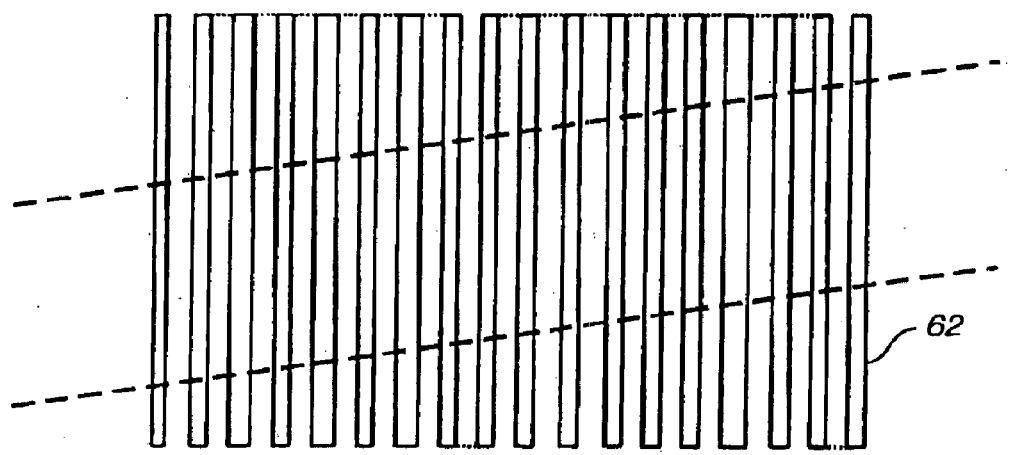
FIG._16
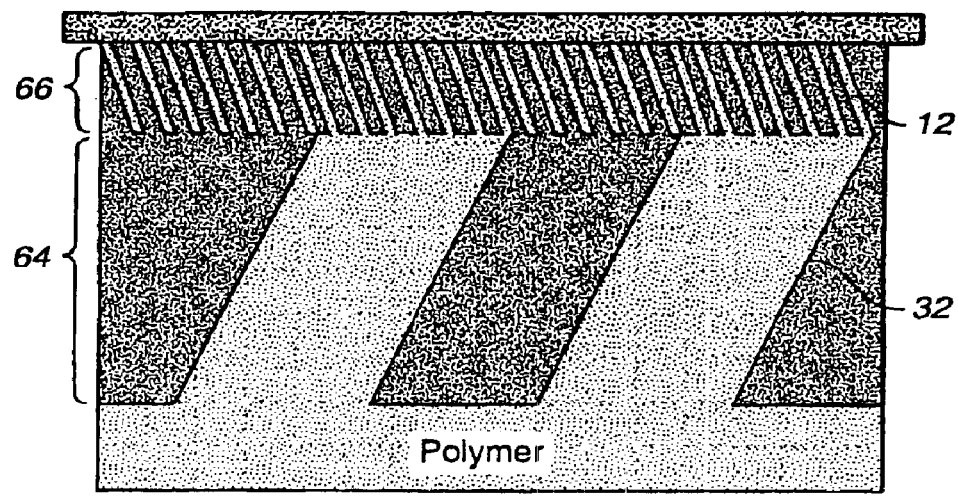
FIG._17

ADHESIVE MICROSTRUCTURE AND METHOD OF FORMING SAME

RELATED APPLICATIONS

This application claims the benefit of the earlier filing date of U.S. Provisional Application No. 60/380,595, filed May 13, 2002, which is incorporated herein by reference.

TECHNICAL FIELD

This invention was made with Government support under Grant (Contract) No. N66001-01-C-8072 awarded by DARPA. The Government has certain rights to this invention.

BRIEF DESCRIPTION OF THE INVENTION

This invention relates generally to the fabrication and use of micro- and nano-scale structures. More particularly, this invention relates to a fabricated adhesive microstructure.

BACKGROUND

There is an ongoing need for improved adhesives. Improved adhesives have applications ranging from everyday aspects of life (e.g., tape, fasteners, and toys) to high technology (e.g., removal of microscopic particles from semiconductor wafers, transporting fiber optic devices, and assembly of sub-mm mechanisms, particularly those including micro-fabricated components, or components that cannot tolerate regular grippers, adhesives, or vacuum manipulators).

Adhesive mechanisms in nature have been studied, but have not been fully understood or exploited. For example, geckos are exceptional in their ability to rapidly climb up smooth vertical surfaces. The mechanism of adhesion used in geckos, Anolis lizards, some skinks, and some insects, has been debated for nearly a century.

It would be highly desirable to identify and exploit the adhesive force mechanism utilized by geckos and other insects. Such information could result in the use of new adhesive microstructures and the fabrication of such structures.

SUMMARY

In one aspect, an embodiment of the invention features a fabricated microstructure. The microstructure comprises at least one protrusion capable of providing an adhesive force at a surface of between about 60 and 2,000 nano-Newtons. The stalk supports the protrusion at an oblique angle relative to a supporting surface, whereby the microstructure can adhere to different surfaces.

In another aspect, an embodiment of the invention features a microstructure comprising a plurality of protrusions. Each protrusion is capable of providing an adhesive force at a surface of between about 60 and 2,000 nano-Newtons. A stalk supports each of the protrusions at an oblique angle relative to a supporting structure.

Various implementations of the invention may include one or more of the following features. The stalk has a length of between about 0.5 and 20 microns, and a diameter of between about 50 nanometers and 2.0 microns. The protrusions adhere to the surface by intermolecular forces. The oblique angle is between about 50 and 75 degrees, between about 30 and 60 degrees, or is about 30 degrees.

In yet another aspect, an embodiment of the invention features a fabricated microstructure comprising an array of protrusions. The array has a width less than about 10 microns and each protrusion of the array is capable of providing an adhesive force at a surface by intermolecular forces. Stalks support each of the protrusions at an oblique angle relative to a supporting shaft.

Various implementations of the invention may include one or more of the following features. The stalk has a length of between about 0.5 and 20 microns, and a diameter of between about 50 nanometers and 2.0 microns. The shaft has a length of between about 1 and 500 microns, and a diameter of between about 1 and 10 microns.

In still another aspect, an embodiment of the invention features a fabricated microstructure comprising an array of members. Each member supports an protrusion at an oblique angle relative to the supporting surface. Each protrusion is capable of providing adhesive force at a surface of between about 60 and 2,000 nano-Newtons.

Various implementations of the invention may include one or more of the following features. A terminal end of the protrusion may have a shape selected from the group consisting of a curved segment of a sphere, a flattened segment of a sphere, a sphere, a flattened surface, and an end of a cylinder.

In still another aspect, an embodiment of the invention features a fabricated microstructure comprising an array of stalks. The stalks have a diameter of between about 50 nanometers and 2.0 microns, and a length of between about 0.5 microns and 20 microns. Each stalk supports a spatula at an oblique angle relative to a supporting surface. The spatula has a terminal end that provides an adhesive force.

In a further aspect, an embodiment of the invention features a fabricated microstructure comprising a plurality of shafts extending at an oblique angle from a supporting surface. A plurality of stalks extend at an oblique angle from an end of the shafts opposite the shaft ends adjacent to the supporting surface. At least one protrusion is formed at the end of the stalk ends opposite the stalk ends adjacent to the shafts. The protrusion is capable of providing an adhesive force at a surface by intermolecular forces.

Various implementations of the invention may include one or more of the following features. The diameter of the shaft is between about 1 and 10 microns, and the length of the shaft is between about 1 and 500 microns. The diameter of the stalks is between about 50 nanometers and 2.0 microns, and the length of the stalks is between about 0.5 and 20 microns. The angle at which the stalks extend from the shafts is between about 50 and 75 degrees, 30 and 60 degrees, or is about 30 degrees. The supporting surface is flexible. A terminal end of the protrusion is capable of providing an adhesive force of between about 60 and 2,000 nano-Newtons. The protrusion has a Young's modulus of between about 0.1 and 20 giga-Pascals. The protrusion is hydrophobic.

In yet another aspect, an embodiment of the invention features a method of fabricating an adhesive microstructure. The method comprises fabricating an array of stalks and forming said array of stalks such that the stalks support a protrusion obliquely relative to a supporting surface wherein the protrusion can provide an adhesive force at a surface.

Various implementations of the invention may include one or more of the following features. The array of stalks is constructed using a template. The template is molded with a polymer. The template is sheared under stress and a temperature to deform it. The template is polished at an angle. The array of shafts are constructed using an imprinting technique.

In another aspect, an embodiment of the invention features a method of fabricating an adhesive microstructure comprising molding a structure having shafts supporting a plurality of stalks at an oblique angle. The structure is removed to provide a template. The template is molded with a polymer, and the template is separated from the polymer to form the microstructure.

Various implementations of the invention may include one or more of the following features. The shafts comprise micro-scale, high aspect ratio members and the stalks comprise nano-scale, high aspect ratio members. The polymer is a liquid polymer or sputtered polymer.

In yet another aspect, an embodiment of the invention features a method of fabricating an adhesive microstructure comprising joining a first template having a first set of pores that have a first diameter and that are at an oblique angle relative to a surface of the first template to a second template. The second template has a second set of pores that have a second diameter less than the first diameter, and the second set of pores form an oblique angle relative to the first set of pores. The first and second templates are molded, and the templates are removed to form the microstructure.

Various implementations of the invention may include one or more of the following features. The first set of pores have a diameter between about 1 and 10 microns, and a length between about 1 and 500 microns. The second set of pores have a diameter between about 50 nanometers and 2.0 microns, and a length between about 0.50 and 20 microns. The first and second templates are molded with a polymer. The first and second templates are joined by bonding.

In still another aspect, an embodiment of the invention features a method of fabricating an adhesive microstructure comprising self-assembling a nano-pore array including two different polymers. The array is sheared and one of the polymers is removed to form a microstructure having an array of stalks with the stalks able to support at least one protrusion at an oblique angle. The protrusion provides an adhesive force at a surface by intermolecular forces.

Certain embodiments of the invention can include one or more of the following advantages. A fabricated microstructure provides improved adhesion to rough surfaces, while being relatively easy to disengage by peeling or pushing. The so-called "hairs" of the fabricated microstructure can be packed in a relatively dense array, while not matting to each other.

The details of one or more embodiments of the invention are set forth in the accompanying drawings and the description below. Other features, objects and advantages of the invention will be apparent from the description and drawings, and from the claims.

BRIEF DESCRIPTION OF DRAWINGS

For a better understanding of the invention, reference should be made to the following detailed description taken in conjunction with the accompanying drawings, in which:

FIG. 1A is an enlarged schematic view of a single extended surface of a fabricated spatula or protrusion on a stalk, in accordance with an embodiment of the invention.

FIG. 1B is an enlarged schematic view of a single extended surface of a fabricated spatula or protrusion on a stalk, in accordance with another embodiment of the invention.

FIG. 2 is an enlarged view of a single gecko seta.

FIG. 3 schematically illustrates a pair of stalks with a spatula or protrusion at their ends.

FIG. 4 graphically illustrates maximum stalk length for a given stalk radius to avoid matting.

FIG. 5 schematically illustrates a Coulomb friction model with adhesion.

FIG. 6A is a cantilever model for an adhesive microstructure in accordance with an embodiment of the invention.

FIG. 6B schematically illustrates the forces on the spatula or protrusion of the microstructure of FIG. 6A.

FIGS. 7A and 7B schematically illustrate contact friction force dependence on spatula or protrusion sliding direction.

FIG. 8 graphically illustrates maximum displacement Δn dependence on cantilever angle.

FIG. 9 schematically illustrates different cantilever angles for a fabricated adhesive microstructure.

FIG. 10 graphically illustrates predicted normal force at a spatula or protrusion, in accordance with an embodiment of the invention, for quasi-static sliding contact.

FIG. 11 schematically illustrates a compounded cantilever fabricated adhesive microstructure under tension and release, in accordance with an embodiment of the invention.

FIG. 12 schematically illustrates a single layer patch or array design of a fabricated adhesive microstructure, in accordance with an embodiment of the invention.

FIGS. 13A–13C schematically illustrate a template fabricated by molding already existing or fabricated high aspect ratio micro/nano-structures, in accordance with an embodiment of the invention.

FIGS. 14A–14C schematically illustrate a technique for forming a template by mechanically indenting a surface at an angle and then molding it.

FIG. 15 schematically illustrates forming a fabricated adhesive microstructure by shearing a template molded with a polymer.

FIG. 16 schematically illustrates polishing both sides of a template to produce a fabricated adhesive microstructure.

FIG. 17 schematically illustrates bonding micro- and nano-hair templates and molding them to form a fabricated adhesive microstructure.

Like reference numerals refer to corresponding parts throughout the drawings.

DETAILED DESCRIPTION

The invention is directed toward the use of microfabricated structures to achieve adhesion. In particular, the invention uses a fabricated seta-like structure. As shown in FIGS. 1A and 1B, a seta-like structure 10 includes a stalk 12. Positioned at an end of the member or stalk 12 is a spatula or protrusion 14. An array of spatulae or protrusions may also be located at the end of the stalk. The stalk supports the spatula, or an array of spatulae, at an oblique angle (neither perpendicular nor parallel) relative to a supporting surface 16. This angle may be between about 15 and 75 degrees (°), and more preferably between about 30° and 60°. This angle, in one embodiment, is 30°.

The supporting surface 16, for instance, may be a shaft or substrate. As shown in FIGS. 1A and 1B, the supporting surface 16 is a flexible or compliant substrate. This substrate may be made from such materials as polymers, for example, polyester, polyurethane and polyimide.

Ideally, each spatula 14 or each spatula of the array of spatulae has an extended surface 18 at its terminal end. The extended surface may be in the form of a paddle or flattened surface (FIG. 1A), a flattened segment of a sphere, a sphere, an end of a cylinder, or a curved segment of a sphere (FIG.

1B). Adhesion is produced as the spatula or array of spatulae produce intimate contact with a surface.

In general, the stalk 12 is between about 0.5 microns ($\mu$m) and 20 $\mu$m in length. The diameter of the stalk is between about 50 nanometers (nm) and 2.0 $\mu$m. A supporting shaft (See FIG. 11), which can form a supporting surface as discussed in more detail below, may be about 1 and 500 $\mu$m long, preferably approximately 10 to 150 $\mu$m long. The diameter of the shaft is between about 1 and 10 $\mu$m.

The terminal end of the stalk has, as noted, at least one spatula or protrusion. A protrusion can provide an adhesive force at a surface of between about 60 and 2,000 nano-Newtons. As noted, a stalk may include an array of spatulae including, for instance, 100 protrusions. The seta structure 10 may have between 1 and 1,000 spatulae. An array of spatulae of the structure 10 is preferably less than 10 $\mu$m wide, preferably approximately 1 $\mu$m wide.

The force produced by a single seta of the invention can vary from approximately 60 nano-Newtons to 200 micro-Newtons ($\mu$N). As noted, a seta may include between 1 and 1,000 spatulae. Thus, the average force provided by each spatula or protrusion is between about 0.06 to 0.20 $\mu$N, or between about 60 and 200 nano-Newtons. The worst case performance would be a single spatula on a stalk with 60 nano-Newtons adhesion. A better case performance would be 1,000 spatulae on a stalk, each with 2 $\mu$N adhesion, with 10% sticking, so a net of 200 $\mu$N.

The adhesive force of a seta from a Tokay gecko (Gecko gecko) depends upon its three-dimensional orientation (spatulae pointing toward or away from the surface) and the extent to which the seta is preloaded (pushed into and pulled along the surface) during initial contact. A pull parallel to the surface shows that the force produced by the inactive, non-spatular region increases with a normal or perpendicular force, typical of a material with a coefficient of friction equal to 0.2. By contrast, when the active spatular region is projecting toward the surface, the force increases by 20 to 60-fold. The force resulting from pulling the seta parallel to the surface during attachment increases when setae are first pushed toward the surface, providing a perpendicular pre-loading force. This initial perpendicular force need not be maintained during the subsequent pull. Setal force parallel to the surface increases linearly with the perpendicular pre-loading force.

Experiments in which naturally occurring seta were pulled away from the surface of a wire demonstrated that perpendicular preloading alone is insufficient to prevent the seta from being dislodged easily. Seta that were first pushed into the surface and then pulled parallel to it developed over ten times the force (13.6 $\mu$N±2.6 SD; N=17) upon being pulled away from the surface than those having only a perpendicular preload (0.6 $\mu$N±0.7 SD; N=17). The largest parallel forces were observed only following a few microns of sliding. The results of preloading on setal force production suggest that a small perpendicular preloading force in concert with a rearward displacement or parallel preload may be necessary to "engage" adhesion. Preloading is believed to increase the number of spatulae contacting the surface.

The orientation of the setae is also important in detachment. The force produced when a naturally occurring seta was pulled away from the surface was not significantly differently from the force measured during a pull parallel to the surface if the same perpendicular preload was given. However, it has been identified that setae detached at a similar angle (30.6°±1.8 SD; N=17) and force when pulled away from a sensor's surface. To check for the presence of a critical angle of detachment, the perpendicular force was held constant, while the setal angle was progressively increased until detachment. Setal angle at detachment changed by only 15% over a range of perpendicular forces. Thus, the detachment angle may be between about 25° and 35°. The detachment angle values are based upon the seta structure in which the shaft of the naturally occurring seta is roughly perpendicular to the spatular surface, as shown in FIG. 2, which is an enlarged view of a single gecko seta 20. This figure illustrates that a shaft 22 of the seta is roughly perpendicular to a naturally occurring spatulae 24 positioned at the end of the shaft 22. Change in the orientation of the setae and perhaps even the geometry of the spatulae may facilitate detachment.

The foot of a Tokay gecko (Gekko gecko) holds approximately 5000 setae mm$^{-2}$ and can produce 10 N of adhesive force with approximately 100 mm$^2$ of pad area. Therefore, each seta should produce an average force of 20 $\mu$N and an avenge stress of 0.1 N mm$^{-2}$ (~1 atm). The actual magnitudes are probably greater, since it is unlikely that all setae adhere simultaneously.

Single-seta force measurements suggest that if all setae were simultaneously and maximally attached, a single foot of a gecko could produce 100 N of adhesive force (−10 arm). Stated another way, the foot of a gecko could generate maximum observed force (10 N) with only 10% of its setae maximally attached.

A further discussion of the forces and characteristics of gecko seta is found in U.S. application Ser. No. 09/644,936, filed Aug. 23, 2000 now U.S. Pat. No. 6,787,160 B1, entitled ADHESIVE MICROSTRUCTURE AND METHOD OF FORMING SAME, assigned to the assignee of the subject application, and the entire disclosure of which is hereby incorporated by reference.

Recent results with real gecko hairs and artificial nano-bumps are consistent with a van der Waals hypothesis for adhesion. Artificial nano-bumps have shown adhesion forces of on the order of 100–300 nN for PDMS (silicone rubber) and polyester bumps with tip radius of 300 nm. Thus, with a bump density of $10^8$ cm$^{-2}$, an adhesion pressure of $\approx 3 \times 10^5$ N·m$^{-2}$ could theoretically be obtained, which is sufficient for artificial wall-climbing. However, an array of artificial bumps, even with a compliant backing, will have difficulty adhering to a non-smooth surface. In fact, it is reasonable to assume that two rigid non-smooth planar surfaces will contact at only three points; thus, the adhesion of an array of nano-bumps will be quite minimal. Each nano-bump must be able to adapt to surface height variations. By making the bumps long and skinny, rough surfaces can be adhered to. The problem with long skinny bumps is that they are as likely to stick to each other as to a contacting surface, becoming hopelessly matted and tangled. Thus, they need to be made in such a way that they do not stick to each other. The present invention describes the design and fabrication of "hairs" which adhere well to surfaces yet do not stick to each other.

An end terminal 18 of the seta-like structure 10 is assumed to have a constant adhesion force of $F_o$=200 nN normal to a contacting surface, independent of contact angle. (This could correspond to the spherical spatula of FIG. 1B.) The end terminal is assumed to have dry Coulumb friction with a friction coefficient $\mu$. Thus, the spatula 14 will slide if the tangential force at the spatula $F_t$ is greater than $\mu(F_o-F_n)$, where $F_n$ is the normal force component pulling the spatula off the surface. Quasi-static conditions (neglecting acceleration and dynamics) are also assumed, that is, $F_t \approx \mu(F_o - F_n)$.

To prevent the setal stalks 12, which are assumed to be perfectly elastic, from sticking to each other, they need be spaced far enough apart and be made stiff enough. The adhesive force between the stalks is assumed to be equal to the adhesive force at the contacting surface. The adhesive force is also considered to be independent of stalk diameter, as the true contact radius at the terminal end of the stalk will be hard to control. A point load $F_o$ is assumed to be present at the end of a cantilever where $F_o$ is the adhesive force of a spatula 14 ($\approx$200 nN), as shown in FIG. 3.

First, make sure the stalk is long enough that the extension of the stalk does not need to be considered. A springy stalk might be possible; however, this requires a different set of equations. Let stalk length and radius be l and r, respectively. Choose l, r such that the stiffness $k_x$ is much greater than the stiffness $k_y$. For a cylindrical cantilever with modulus $E_{PE}$, and moment of inertia $I = \pi r^4/4$, $$\Delta y = \frac{F_y l^3}{3 E_{PE} I} \quad (1)$$

Thus, the lateral stiffness is:

$$k_y = \frac{F_y}{\Delta_y} = \frac{3\pi r^4 E_{PE}}{4 l^3} \quad (2)$$

The stiffness along the beam axis is:

$$k_x = \frac{\pi r^2 E_{PE}}{l} \quad (3)$$

$$\frac{k_x}{k_y} = \frac{4 l^2}{3 r^2} \quad (4)$$

Then the ratio of axial to lateral stiffness is:
To obtain a 100:1 ratio in stiffnesses, simply use l>9 r.

Second, the stalks must be spaced far enough apart that the spatula would prefer to stick to another surface rather than to each other. As shown in FIG. 3, the stalks 12 are $\Delta$ apart, hence $F_o$ must be less than $k_y \Delta/2$. Now given the adhesion force of a single spatula 14, the modulus of elasticity, the stalk length and radius, the minimum spacing can be determined:

$$\Delta \geq \sqrt{\frac{8 F_o l^3}{3\pi r^4 E_p E}} \quad (5)$$

Of course, Equation (5) only makes sense for $\Delta > 2$ r, the spacing greater than the stalk diameter, for approximately square lattice or array packing. This equation should also keep the stalks from buckling, since they are stiff enough to overcome the adhesion force.

Now the adhesion pressure $P_{adh}$ can be calculated based on the force of each spatula and the area taken by each spatula stalk:

$$P_{adh} = \frac{F_o}{\Delta^2} = \frac{9\pi^2 E_{PE}^2}{64 F_o}\left(\frac{r^8}{l^6}\right) \quad (6)$$

Equation (6) provides the following interesting observations:
1. Smaller $F_o$ gives higher pressure. (With lower $F_o$ stalks can have a smaller radius and be closer.);
2. Stiffer stalks allow greater packing density; and
3. Short, fat stalks give higher adhesion pressure. (However, short fat stalks are bad for adhering to rough surface.)

All of these observations depend on the assumption of avoiding sticking between stalks.

For the last step, a relationship between l and r is fixed to obtain a desired $P_{adh}$. A maximum stalk radius for a square lattice can be found from:

$$r_{max} = \frac{1}{2}\sqrt{\frac{F_o}{P_{adh}}} \quad (7)$$

using minimum area of 4 $r^2$. Solving Equation (6) for r, l gives:

$$\frac{r^4}{l^3} = \sqrt{\frac{64 P_{adh} F_o}{9\pi^2 E_{PE}^2}} = \frac{8}{3\pi E_{PE}}\sqrt{P_{adh} F_o} = l_o \quad (8)$$

where $l_o$ is a constant with units of length. Thus, for a desired contact pressure, and stalk length l, the following is given:

$$r = l_o^{\frac{1}{4}} l^{\frac{3}{4}} \text{ or } l = l_o^{\frac{-1}{3}} r^{\frac{4}{3}} \quad (9)$$

The parameters for polyester and PDMS stalks are shown in Table 1. Note that the PDMS stalk is basically a bump, so it will not provide very useful adhesion except to a perfectly planar surface.

TABLE 1

| Parameter | Polyimide | Polyester | PDMS |
|---|---|---|---|
| Young's modulus | 2 GPa | 850 MPa | 600 kPa |
| adhesion force $F_0$ | 200 nN (?) | 200 nN | 200 nN |
| $l_{max}$ ($P_{adh}$ = 50 kPa, $r_{max}$ = 1 μm) | 28 μm | 20 μm | 1.9 μm |
| $l_{max}$ ($P_{adh}$ = 100 kPa, $r_{max}$ = 0.7 μm) | 16 μm | 12 μm | 1.1 μm |

FIG. 4 shows the maximum stalk length for a given stalk radius to avoid stalks sticking together. It is interesting to note that with r=0.15 μm, the stalk length is only 1 μm. Hence, a two level structure of longer, stiffer base shafts may be used with fine terminal stalks (spatular hairs) to match rough surfaces.

During preload, the stalks may contact a rough surface at different heights, with a height variation $\Delta n$. The stiffness of the stalks should be set such that the pull-off force $F_n = k_n \Delta n$ of a stalk is less than the adhesion force $F_o$. Otherwise, the stalks will pull off when the array is loaded.

The stalks may also be subject to normal displacement during station keeping. When the stalks initially make contact with a surface, the local surface normals may be pointing such that the stalks slide. During station keeping, there may be local sliding within an array, also causing height variation $\Delta n$.

Referring to FIG. 5, the limiting friction force $F_t$ is assumed to be proportional to the normal force $F_n$. Any difference between sliding and static coefficients of friction is ignored. An applied normal force less than the adhesive force ($F_n < F_o$) attempts to pull the spatula 14 off the surface 18. For quasi-static sliding, the tangential force $F_t$ is balanced by the friction force $\mu(F_o - F_n)$. Note that as the normal force $F_n$ increases, the tangential force $F_t$ required to slide the spatula decreases. For sliding without acceleration (the quasi-static assumption), $F_t$ exactly balances the friction force. At pull off, the friction force drops to zero, and hence $F_r \to 0$.

The seta structure 10 is formed as a cantilever-like structure as shown in FIGS. 1A–1B and 6A–6B. As shown in FIG. 6B, $F_r$ is the bending tension force pulling the spatula 14 away from the surface 18. $F_\theta$ is the axial reaction force of the stalk 12 in the compression direction. The axial stiffness is assumed orders of magnitude stiffer than the bending stiffness. Thus, the seta structure 10 has only one degree of freedom (motion $\Delta r$), with $\Delta \theta = 0$. It is permissible for multiple stalks in a patch or an array to slip on a surface. As long as contact is not broken, the stalks still contribute to net adhesive force.

As shown in FIGS. 7A AND 7B, if the 14 spatula slides (under quasi-static conditions), the force on the spatula is on either edge of the contact friction cone (angle$\pm \theta_s$ from the surface normal, where $\theta_s = \tan^{-1} \mu$ is the friction angle).

Using these assumptions, the maximum normal displacement $\Delta n$ can be solved when contact breaks. For quasi-static equilibrium, the normal force $F_n$ is equal to the pull-off force:

$$F_n = F_r \cos \theta + F_\theta \sin \theta F_o \quad (10)$$

At pull-off, since the friction force $\mu(F_o - F_n) = 0$, $$F_t = -F_r \sin \theta + F_\theta \cos \theta = \mu(F_o - F_n) = 0 \quad (11)$$

For quasi-static equilibrium, Equation (10) can be solved for $F_\theta$:

$$F_\theta = F_r \tan \theta \quad (12)$$

Thus, the maximum radial force (due to the cantilever spring) at pull-off is:

$$F_r = F_o \cos \theta \quad (13)$$

Now with bending stiffness $k_r$, $F_r = k_r \Delta r$, and $\Delta r = \Delta n / \cos \theta$, the maximum stalk displacement before contact is broken is obtained:

$$\Delta n = \frac{F_o}{k_r} \cos^2 \theta \quad (14)$$

Equation (14) has some interesting implications. Clearly if the stalks are normal to the surface, no surface roughness is allowed. If they are parallel to the surface, close to maximal compliance would be obtained, but there would not be room for many stalks. If there is significant contact friction, the friction allows a greater $\Delta n$, as would be expected, since then the adhesive contact has both normal and tangential components. The normal displacement $\Delta n$ as a function of cantilever angle $\theta$ is shown in FIG. 8. It appears that $\theta = 30°$ will give a reasonable compromise between surface roughness compatibility and spatula density. (Assumptions: $F_o = 100$ nN, $l = 10$ μm, $r = 0.25$ μm for a polyimide stalk. A long stalk which gives $\Delta n > 5$ μm violates conservative matting conditions.) Note that the large displacement violates the cantilever assumptions, but is still qualitatively appealing.

As shown in FIG. 9, a stalk 12 can be attached to a supporting surface 16 at various angles $\theta$ of 0°, 30° and 60°. Due to the compliance of the cantilever, the force in the $\hat{r}$ direction $F_r$ is controlled by the displacement $\Delta r$. The axial force along the stalk axis $F_\theta$ is a reaction force dependent on the applied force, adhesive force, friction coefficient and contact angle. For static contact, the net force $F_r \hat{r} + F_\theta \hat{\theta}$ is inside the friction cone. For quasi-static sliding, the force is at either the left or right edge of the friction cone, depending on sliding direction. By changing the sliding direction (pushing or pulling the cantilever parallel to the surface), the reaction force $F_\theta$ changes. Thus, the normal force may increase, leading to breaking contact without explicitly pulling the spatula 14 away from the surface 18.

For quasi-static sliding (no acceleration), the tangential force $F_t$ exactly balances the sliding friction force $\mu(F_o - F_n)$. For the spatula sliding left as in FIG. 7A, the normal force $F_n$ and tangential force $F_t$ are:

$$F_n = F_r \cos \theta + F_\theta \sin \theta \quad (15)$$

and $$F_t = -F_r \sin \theta + F_\theta \cos \theta = \mu(F_o - F_n) \quad (16)$$

For the spatula sliding right as in FIG. 7B, the normal force $F_n$ and tangential force $F_t$ are:

$$F_n = F_r \cos \theta - F_\theta \sin \theta \quad (17)$$

and $$F_t = F_r \sin \theta + F_\theta \cos \theta = \mu(F_o - F_n) \quad (18)$$

Solving for the normal force $F_n$, gives $$F_n = \frac{F_r \pm \mu F_o \sin \theta}{\cos \theta \pm \mu \sin \theta} \quad (19)$$

where + and − correspond to sliding left and right, respectively.

The normal force Equation (19) when sliding to the right has several possible implications. First, if $F_r < \mu F_o \sin \theta$, the contact will need to be pushed into the surface to slide right since $F_n < 0$. Perhaps this is helpful for preloading as the spatula will be encouraged to make contact. Second, the normal force is higher for sliding to the left, possibly increasing the tendency for the contact to pull off (See FIG. 10). (Assumptions: stalk is mounted at $\theta = 30°$, $F_o = 200$ nN, $\mu = 0.5$). However, note that at pull-off, since the normal force exactly balances the adhesion force, the tangential force vanishes. Thus, friction should have no effect at pull-off. A third observation is that if the angle of the cantilevered stalk is changed while maintaining a constant $F_r$, the normal force becomes singular when $\theta = \tan^{-1} 1/\mu$. It is interesting to speculate that the spatular/setal stalk structure could act as a compound cantilever, thus changing angle when pushing compared to pulling.

As illustrated in FIG. 11, another embodiment of the invention is a multiple level or compound cantilever structure 30. Structure 30 includes a number of stalks 12 each supporting at least one protrusion or spatula 14 at the angle $\theta$. The stalks are, in turn, supported by a larger shaft 32 at an angle $\theta_1$ relative to a supporting surface 34. Like the surface 16, the supporting surface 34 may be flexible or compliant. As noted, the length of the shaft is between about 1 and 500 μm, and the diameter of the shaft is between about 1 and 10 μm. The angle $\theta_1$, like $\theta$, may be between about 15 and 75°.

For a non-matting cantilever structure, the stalks should be made of a relatively hard material and be less sticky, fatter and shorter to provide a high adhesive pressure. The stalks, as noted, are oblique to the supporting surface. They should also be compliant. Since friction modifies adhesive effect, changing contact shear loading may provide a partial quick release mechanism. Stalk attachment is quite robust to tangential displacement, but not to normal displacement.

For potential ease of fabrication, a single level design with long stalks as shown in FIG. 12 could be used. Here, the stalks 12 are mounted at angle θ of about 30° with l equal to about 10 μm, and r equal to about 0.25 μm. The stalks are made from polyimide. Due to the high aspect ratio and close packing, it may actually be easier to fabricate a two layer structure (FIG. 11), with thick shafts 32 stalks topped with branching small diameter stalks 12. With center-to-center spacing of about 1 μm between the shafts 32, a peak adhesive pressure of $10^5$ $Nm^{-2}$, with all hairs in contact, can be produced. With l=10 μm, local surface roughness of 2.5–5 μm depending on sliding direction can be tolerated. Thus, this structure could stick to relatively smooth surfaces such as cold-rolled steel sheet.

A goal is to fabricate biomimetric gecko foot hairs according to the design criteria discussed above. The difficulty of fabrication is that the hairs must be at an angle. With straight hairs, there is no tolerance for surface roughness. If hairs are very sticky and very compliant, they could bend over and stick on their side, but this would violate the matting condition.

Here, the shafts 32, the micro-scale part of the synthetic hairs, will be termed micro-hairs, and the stalks 12, supporting the spatulae 14, will be termed nanohairs.

The basic parameters of the synthetic hair fabrication can be summarized as follows: high aspect ratio micro (1:10–30) and nano (1:20–50) scale structure fabrication with diameters of 5–10 μm and 100–500 nm, respectively; as high as possible micro/nano hair density (number of micro and nano scale hairs in a given area, e.g. 1 $cm^2$) for high adhesion; as stiff as possible nanohairs for holding the non-matting condition while as soft as possible hairs for maximum contact area and adhesion; material properties of synthetic hairs: Young's modulus: 0.1–20 giga-Pascals (GPa), hydrophobic, and high tensile strength; and micro/nano hairs oriented at an angle (15°–75°) for non-symmetric friction behavior and less buckling instability potential, and tolerance of rough surfaces.

Micro/nanohairs can be fabricated by two methods: nano-molding of fabricated templates and polymer self-assembly or synthetic growth (like in nature).

In the nano-molding based methods, a template that has micro and nano scale high aspect ratio holes representing the negative of the foot hairs can be molded with polymers. The following liquid polymers could be used: polyurethane, polyimide, silicone rubber (Dow Corning Inc., HS II), and polyester resin (TAP Plastics, Inc.). These polymers can be cured at room temperature with UV light or at high temperatures. Also, sputtered polymers, such as Parylene C and N, could be used.

There are a number of design parameters for the template. The template should have oriented or perpendicular holes with a very high aspect ratio (around 1:10–50). The hole diameter should be on the order of 100 nm to 10 μm. The hole length should be between about 3 and 200 μm.

Material properties of the template include resistance to high temperatures if high temperature curable polymers, such as polyimide, are used. The template should also be etchable by chemicals that do not etch polymers. The template should also have smooth top and bottom surfaces (roughness in the order of 1–10 nm) for possible bonding of different templates.

There are two main types of templates. The first is negative template that comprises a substrate with fabricated or self-organized high aspect ratio holes (partially or all along the thickness of the substrate), or printed micro/nano-structures.

Examples include Alumina (Nanopore, Whatman Inc.), polycarbonate (Poretics, Osmonics' Lab Inc.), and other porous material based self-organized membranes. Such templates have different pore diameters, densities and thicknesses of micro/nano-pores, Young's moduli, maximum possible temperatures before plastically deforming, and etching properties as given in Table 2.

TABLE 2

| Material | Pore Diameter (μm) | Thickness (μm) | Max. Temp. (° C.) | Pore Density (pores/$cm^2$) |
|---|---|---|---|---|
| Alumina | 0.02–02 | 60 | 200 | $10^9$ |
| Polycarbonate | 0.02–10 | 7–14 | 140 | $10^5$–$10^8$ |

The first type of template can also be fabricated, for example, by imprinting the desired shape of the micro/nano-hairs using a single sharp probe such as AFM, STM, or glass pipette. An array of such probes or some other high aspect ratio micro/nano-structure array could also be used. Imprinting can be achieved by mechanically indenting a soft surface in a serial robotic process by automatic XYZ position control under an optical microscope or using force feedback in the AFM probe case; melting wax to fill the gaps of the structures; or filling gaps by a curable liquid (UV, high or room temperature curable).

Also, this first type of template may include substrates with micro/nano-holes fabricated using optical lithography, deep reactive ion etching (DRIE) with thermal oxidization processing, black silicon etching, laser micro/nano-machining, electron-beam lithography, nano-imprinting, or solf-lithography.

The second type of template is a positive template that is fabricated by molding already existing or fabricated high aspect ratio stiff micro/nano-structures that are not appropriate to use directly as a synthetic hair (Young's Modulus not in the range of 0.1–20 GPa). These micro/nano-structures, for instance, would be carbon nanotubes, nanowires, or nanorods. Molding of these structures is the same as the imprinting technique discussed above: mechanically indenting a soft surface; melting wax to fill the gaps of the structures; or filling gaps by a curable liquid, rubber or polymer (UV or high or room temperature curable).

As shown in FIGS. 13A–13C, micro/nano-structures can be molded by a melted wax or a liquid 48 (FIG. 13A). The original structure 50, as shown in FIG. 13B, is then removed, for example, by etching, to obtain the template 52. The template is then molded by a polymer 54, and the template is removed (FIG. 13C).

More specifically, the basic steps of this approach may be as follows. First, as discussed, fabricate the template 52 with micro and nano-scale high aspect ratio holes (FIGS. 13A and 13B). Next, mold the template with a polymer 54 and block the bottom layer by temporarily attaching a substrate 56 to it (FIG. 13C).

A liquid polymer can be poured under vacuum or in air over to the open side of the template. Electrokinetics type of electrostatic principle can be also used if a conductive polymer is chosen as the filling material. Alternatively, if the permittivity of the polymer is higher than the surrounding mold, an applied electric field could promote filling. Alternatively, for sputtered polymers, deposit the polymer, such as Parylene C or N, into the pores conformally. Finally, peel off the polymer or remove the template, for example, by etching. If wet etching is used, hydrophobic polymers in the etchant solution would stick to each other due to the hydrophobic attraction. Therefore, external excitation, such as ultrasonic vibration or proper surfactants for the given etchant, should be used during this process to minimize the self-sticking problem.

For another fabrication technique, nanohairs can be grown as organic carbon nanotubes or other synthetic nanotubes or nanowires that have Young's modulus and aspect ratio close to the required synthetic gecko hairs using CVD or other chemical synthesis methods. Additionally, block co-polymer self-assembly can be used to grow the synthetic hairs directly. In the block co-polymer method, a nano-pore array including two different polymers would be self-assembled. The array would then be sheared and one of the polymers removed to form an adhesive microstructure. For example, one of the polymer materials could be dissolved in an appropriate solvent, leaving the other material in a self-assembled hair structure.

Still another fabrication technique involves duplicating the biological gecko foot hairs directly. Biological hairs can be bonded to a substrate and then molded using wax or silicone rubber type of materials that can fill very small gaps and that can be cured at room or low temperatures, or using UV light. After curing, biological hairs can be peeled off or etched away using acids. Thus, a duplicate template of the hairs can be formed, and then this template is molded with polymers to get synthetic hairs with almost the exact shape as the real ones. Since gecko foot lamella can be peeled easily and be replaced by the animal with regular intervals, this process would be feasible, and also the template can be used many times before contamination.

As noted, the spatula or array of spatulae are supported obliquely by the stalks of the synthetic gecko hairs. The correct orientation of the spatula or array of spatulae may be achieved in a number of different ways.

For instance, as shown in FIGS. 14A–14C, a soft surface 40, such as a wax, may be indented by a sharp probe 42 at an angle and then molded with a polymer 44. Also, a molded template 60, as shown in FIG. 15, can be sheared under stress (arrow A) and at a specific temperature to plastically deform it to a desired angle θ. Alternatively, as shown in FIG. 16, a template 62 may be polished at each side at an angle to form the proper orientation of the hairs.

Another technique for orienting the spatula or protrusions is the dry etching (e.g. DRIE) of an inclined silicon wafer. Other techniques include: magnetic, electrostatic, (di) electrophoresis type of external force based orientation of magnetic, conductive, or dielectric nanorod, nanowire, nanotube micro/nano-structures on a substrate wherein oriented structures are molded with a wax or silicone rubber kind of materials to provide the template. The template is then molded with a polymer.

The above processes are focused on fabricating micro- or nano-scale synthetic oriented hairs. However, the nanohairs need to be integrated with microhairs to get the desired overall configuration.

Therefore, for instance, as shown in FIG. 17, micro and nanohair templates 64 and 66, respectively, with proper thickness and pore size and density, are fabricated separately and bonded to each other to get one template. For example, a polycarbonate Nucleopore membrane with 200 nm hole diameter can be bonded to another polycarbonate membrane or a silicon substrate with 6 µm hole diameter fabricated, for example, by DRIE.

Also, it is possible to fabricate oriented silicon or any other material microstructures with the same dimensions with synthetic gecko micro-hairs using micro-fabrication techniques. Then, grow oriented carbon nanotubes, nanowires or nanorods oriented with external magnetic or electric fields, directly on these microstructures. After this deposition or growth process, everything can be molded with wax or silicone rubber, for instance, to get the overall template.

After getting the overall template using the above techniques, both templates can be molded simultaneously with a polymer, deforming them under shear stress to get angles (FIG. 15), and then the template can be etched away to get the polymer hairs. Alternatively, the two micro and nano templates can be sheared at elevated temperatures before bonding them together.

The templates may be bonded, for example, under a vacuum or a compressive load. As noted, the templates may then be removed by etching with an etchant that removes the template material but not the material from which the hair structure is made.

Self-assembled oriented nanohairs can also be grown on a polymer substrate. Afterwards, the polymer substrate can be patterned using micro-fabrication techniques to provide microhairs under nanohairs directly.

Those skilled in the art will recognize that the adhesive microstructures of the invention may be used in a variety of ways. For example, the microstructures can be used in pick and place micromanufacturing, micromanipulation, and microsurgery applications. For example, a seta-like structure can be attached to a micromanipulator to pick up a fiber optic, move it, and put it down again. Other uses include manipulating retinal prosthesis implants/explants, attaching to nerves during surgery, and pick and place of silicon wafers or disk drive components.

The microstructures may also be used as clutch mechanisms in micromachines. Since they adhere in a directional manner, a microstructure could be used as a clutch mechanism similar to a ratchet, but on a smooth surface.

Other applications include: insect trapping, tape, robot feet or treads, gloves/pads for climbing, gripping, clean room processing tools, micro-optical manipulation that does not scar a surface and leaves no residue or scratches, micro-brooms, micro-vacuums, flake removal from wafers, optical location and removal of individual particles, climbing, throwing, and sticker toys, press-on fingernails, silent fasteners, a substrate to prevent adhesion on specific locations, a broom to clean disk drives, post-it notes, band aids, semiconductor transport, clothes fasteners, and the like. In many of these applications, patches of spatula on a planar substrate are used, as opposed to patches of spatula positioned on a shaft.

The foregoing description, for purposes of explanation, used specific nomenclature to provide a thorough understanding of the invention. However, it will be apparent to one skilled in the art that the specific details are not required in order to practice the invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best use the invention and various embodiments with various modifications as are suited to the particular use contemplated. It is intended that the scope of the invention be defined by the following claims and their equivalents.

What is claimed is:

1. A fabricated microstructure comprising:
   at least one protrusion capable of providing an adhesive force at a surface of between about 60 and 2,000 nano-Newtons;
   a stalk to support said protrusion at an oblique angle relative to a supporting surface; and
   wherein the microstructure is capable of adhering to different surfaces.

2. A fabricated microstructure comprising:
   a plurality of protrusions, each protrusion capable of providing an adhesive force at a surface of between about 60 and 2,000 nano-Newtons; and
   a stalk to support each of said protrusions at an oblique angle relative to a supporting structure.

3. The fabricated microstructure of claim 2 wherein the stalk has a length of between about 0.5 and 20 microns, and a diameter of between about 50 nanometers and 2.0 microns.

4. The fabricated microstructure of claim 2 wherein said protrusions adhere to the surface by intermolecular forces.

5. The fabricated microstructure of claim 2 wherein the oblique angle is between about 15 and 75 degrees.

6. The fabricated microstructure of claim 5 wherein the oblique angle is between about 30 and 60 degrees.

7. The fabricated microstructure of claim 5 wherein the oblique angle is about 30 degrees.

8. A fabricated microstructure comprising:
   an array of protrusions, said array having a width less than about ten microns and each protrusion of said array capable of providing an adhesive force at a surface by intermolecular forces; and
   a stalk to support each of said protrusions at an oblique angle relative to a supporting shaft.

9. The fabricated microstructure of claim 8 wherein the stalk has a length of between about 0.5 and 20 microns, and a diameter of between about 50 nanometers and 2.0 microns.

10. The fabricated microstructure of claim 9 wherein the shaft has a length of between about 1 and 500 microns, and a diameter of between about 1 and 10 microns.

11. A fabricated microstructure comprising: an array of members;
    each member supporting a protrusion at an oblique angle relative to a supporting surface; and
    wherein each protrusion is capable of providing an adhesive force at a surface of between about 60 and 2,000 nano-Newtons.

12. The fabricated microstructure of claim 11 wherein a terminal end of the protrusion has a shape selected from the group consisting of a curved segment of a sphere, a flattened segment of a sphere, a sphere, a flattened surface, and an end of a cylinder.

13. A fabricated microstructure comprising: an array of stalks;
    said stalks having a diameter of between about 50 nanometers and 2.0 microns, and a length of between about 0.5 microns and 20 microns;
    each stalk supporting a spatula at an oblique angle relative to a supporting surface; and
    the spatula having a terminal end that provides an adhesive force.

14. A fabricated microstructure comprising:
    a plurality of shafts extending at an oblique angle from a supporting surface;
    a plurality of stalks extending at an oblique angle from an end of the shafts opposite the shaft ends adjacent the supporting surface;
    at least one protrusion formed at an end of the stalks opposite the stalk ends adjacent the shafts; and
    wherein the protrusion is capable of providing an adhesive force at a surface by intermolecular forces.

15. The fabricated microstructure of claim 14 wherein the diameter of the shafts is between about 1 and 10 microns, and the length of the shafts is between about 1 and 500 microns.

16. The fabricated microstructure of claim 15 wherein the diameter of the stalks is between about 50 nanometers and 2.0 microns, and the length of the stalks is between about 0.5 and 20 microns.

17. The fabricated microstructure of claim 14 wherein the angle from which the stalks extend from the shafts is between about 15 and 75 degrees.

18. The fabricated microstructure of claim 17 wherein the angle from which the stalks extend from the shafts is between about 30 and 60 degrees.

19. The fabricated microstructure of claim 17 wherein the angle from which the stalks extend from the shafts is about 30 degrees.

20. The fabricated microstructure of claim 14 wherein the supporting surface is flexible.

21. The fabricated microstructure of claim 14 wherein a terminal end of the protrusion is capable of providing an adhesive force of between 60 and 2,000 nano-Newtons.

22. The fabricated microstructure of claim 14 wherein the protrusion has a Young's modulus of between about 0.1 and 20 giga-Pascals.

23. The fabricated microstructure of claim 14 wherein the protrusion is hydrophobic.

24. A method of fabricating an adhesive microstructure, said method comprising the steps of:
    fabricating an array of stalks; and
    said array of stalks formed such that the stalks support a protrusion obliquely relative to a supporting surface wherein the protrusion can provide an adhesive force of between about 60 and 2,000 nano-Newtons at a surface.

25. The method of claim 24 wherein said fabricating step includes the step of constructing said array of stalks using a template.

26. The method of claim 25 wherein said fabricating step includes molding said template with a polymer.

27. The method of claim 26 wherein said template is sheared under stress and a temperature to deform it.

28. The method of claim 26 wherein each side of said template is polished at an angle.

29. The method of claim 24 wherein said fabricating step includes the step of constructing said array of shafts using an imprinting technique.

* * * * *